United States Patent [19]
Engelstein et al.

[11] Patent Number: 4,495,257
[45] Date of Patent: Jan. 22, 1985

[54] HORIZONTAL BATTERY HOLDER FOR CYLINDER CELLS

[75] Inventors: Charles Engelstein, South Orange, N.J.; David L. Kassel, New York; Harry Goodman, Rockville Centre, both of N.Y.

[73] Assignee: Memory Protection Devices, Inc., Farmingdale, N.Y.

[21] Appl. No.: 527,220

[22] Filed: Aug. 29, 1983

[51] Int. Cl.³ .............................................. H01M 2/100
[52] U.S. Cl. .................................... 429/100; 429/178
[58] Field of Search ....................... 429/100, 98, 97, 96, 429/9, 1, 99, 178; 339/17 R

[56] References Cited

U.S. PATENT DOCUMENTS

| | | | |
|---|---|---|---|
| 4,031,295 | 6/1977 | Rigazio | 429/100 |
| 4,247,603 | 1/1981 | Leffingwell et al. | 429/1 |
| 4,281,727 | 8/1981 | Meeks | 429/98 |
| 4,291,106 | 9/1981 | Hooke | 429/1 |
| 4,414,298 | 11/1983 | Krenz | 429/100 |

*Primary Examiner*—Charles F. Lefevour
*Attorney, Agent, or Firm*—Bucknam and Archer

[57] ABSTRACT

A battery holder for a cylinder cell is provided with a casing which receives the cell against its bottom and constrains the cell in a peripheral barrier with resilient contacts at its ends. The holder optionally has terminals projecting through its bottom for printed circuit board mounting or flat terminals with eyelets projecting from the top of the holder. A snap-on cover, which facilitates removal of the battery, can be provided.

5 Claims, 7 Drawing Figures ns in recesses (24) in the top of the

HORIZONTAL BATTERY HOLDER FOR CYLINDER CELLS

BACKGROUND OF THE INVENTION

This invention relates in general to battery holders, and more particularly, to a battery holder for a cylinder cell.

In the recent past, the cylinder cell has been utilized in computers, microprocessors, and other electronic units and systems. One important potential area of application is for the mounting of cylinder cells upon printed circuit boards, and the invention provides a battery holder that is readily mounted on a printed circuit board.

Cylinder cell battery holders are known in the prior art as exemplified by U.S. Pat. No. 3,181,974 to La Barbera, and U.S. Pat. No. 4,031,295 to Rigazio, which both disclose rectangular housings with ejector means.

German Offenlegungsschrift No. 2,911,277 discloses a modular battery housing of one piece construction with contact inserts having prongs which can be inserted into a printed circuit card.

SUMMARY OF THE INVENTION

The present invention provides a battery holder for a cylinder cell which comprises a casing, a first electrically conductive contact which engages one pole of the cylinder cell, and a second electrically conductive contact which engages the other pole thereof.

The casing has a bottom and a peripheral barrier at the ends and sides and is configured to receive the cylinder cell against the bottom, and to constrain it within the peripheral barrier. Features of the invention include a special locating nub designed so that installation on a printed circuit board can be done in only one positive direction, and a snap-on cover for the holder. Another embodiment of the invention comprises a tab terminal for hardwire soldering and eyelet mounting. The casing is of one piece molded construction.

DETAILED DESCRIPTION OF THE INVENTION

Figure 1:
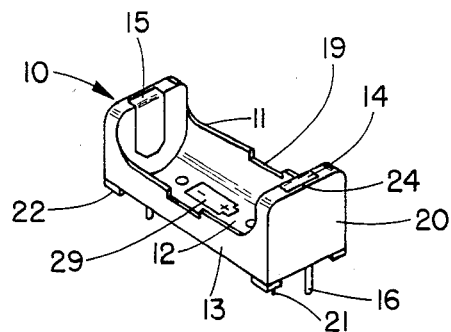
FIG. 1 is a perspective view of a battery holder according to one embodiment of the invention.

From FIG. 1, it can be seen that the battery holder (10) is simply constructed from three basic parts; a casing (11), a positive terminal (14), and a negative terminal (15). The casing (11) comprises a bottom (12), and a peripheral barrier consisting of peripheral walls (13) and ends (20), which cooperate with the resilient terminals (14, 15) mounted in recesses (24) in the top of the ends to hold a cylindrically-shaped battery in place. The terminals (14, 15) are U-shaped with one leg of the U being located in one of the end recesses (24), and the other leg being resilient and free to contact one of the battery terminals. The terminals (14, 15) also have portions (16) which project through slits (17 in FIG. 3) in the bottom of the casing and which can project through a printed circuit board prior to a wave-soldering operation, as shown in FIG. 4. The casing (11) also has eyelet mounting holes (18), polarity markings (29), and one or more removal slots (19). The slots facilitate removal of the battery from the holder by means of a blunt nonmetallic tool (not shown).

The configuration of casing (11) is such as to enclose and abut with a cylindrical cell, but could be varied in shape to accomodate a cell of a different shape, e.g.; a cell having a rectangular cross-section.

As shown in FIG. 4, the holder sits on raised mounting tabs (22) which permit free air flow around the body and insulation from extreme solder bath temperatures. Also, as shown in FIG. 4, a positive locating nub (21) is located on one of the mounting tabs, and is designed so that the holder can be mounted on a printed circuit board in only one positive direction.

Figure 2:
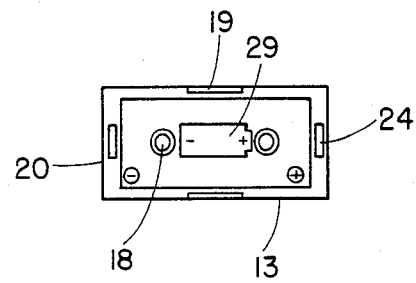
FIG. 2 is a top view of the battery holder of FIG. 1.
Figure 3:
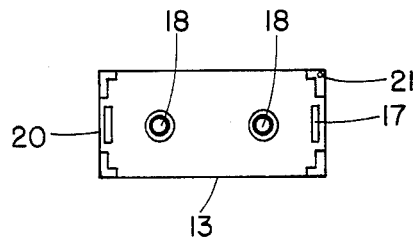
FIG. 3 is a bottom view of the battery holder of FIG. 1.
Figure 4:
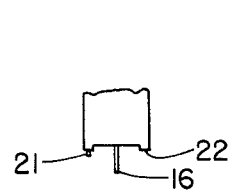
FIG. 4 is a detailed view of the terminal layout of the holder of FIG. 1.
Figure 5:
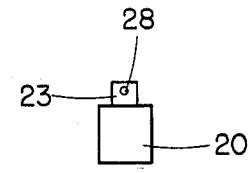
FIG. 5 is a detailed view of the terminal layout of another embodiment of the invention, a holder otherwise similar to the holder of FIG. 1.

FIG. 5 shows another embodiment of the invention wherein all of the elements of the holder are as shown in FIGS. 1-3, but the terminal layout of the holder differs in the end (20) not having contact projecting portions (16) beneath it, but rather has tab terminals (23), each with an aperture (28), projecting from the top of the ends (20) to facilitate hardwire soldering.

Figure 6:
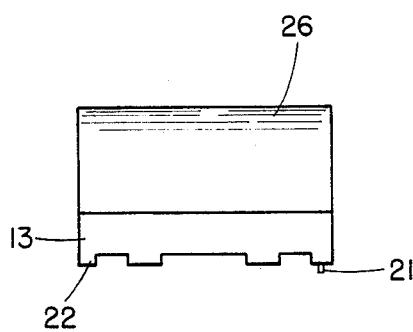
FIG. 6 is a view, partially in section, of the holder of FIG. 1, showing lengthwise with a battery enclosed by a snap-on cover.
Figure 7:
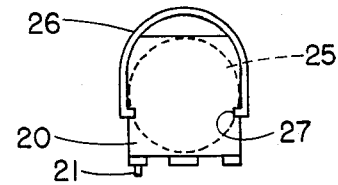
FIG. 7 shows an end view, partially in section, of the holder of FIG. 1 with the snap-on cover enclosing a battery.

FIGS. 6 and 7 disclose a snap-on cover (26) which fits over a battery (25) and which has flanges (27) which fit into removal slots (19) of the casing. The snap-on cover can be used to remove the battery from the holder.

It will be obvious to those skilled in the art to which the invention pertains, that various changes and modifications may be made therein without departing from the spirit and scope of the invention, as defined by the claims appended thereto.

What is claimed is:

1. A battery holder comprising:
 (a) a casing having a bottom end and a peripheral barrier means, the casing being disposed to receive a battery cell abutting the bottom and the peripheral barrier means, the casing being shaped such that its inner surface matches the contour of said cell;
 (b) an electrically conductive terminal having one leg located in a recess in said peripheral barrier and another leg being resilient and contacting one pole of said battery when said battery is in place within said holder;
 (c) another electrically conductive terminal with one leg located in another recess in said peripheral barrier and another leg being resilient and contacting the other pole of said battery when said battery is in place within said holder;
 (d) said electrically conductive terminals each having a portion projecting from the top of said recess in said peripheral barrier and having one or more apertures to facilitate hard wire soldering, and
 (e) a plurality of raised mounting tabs projecting from the bottom of said casing.

2. A battery holder according to claim 1, further comprising one or more positive locating nubs projecting from the bottom of one of said raised mounting tabs whereby the holder can be mounted on a printed circuit board in only one positive direction.

3. A battery holder comprising:
   (a) a casing having a bottom end and a peripheral barrier means, the casing being disposed to receive a battery cell abutting the bottom and the peripheral barrier means, the casing being shaped such that its inner surface matches the contour of said cell;
   (b) an electrically conductive terminal having one leg located in a recess in said peripheral barrier and another leg being resilient and contacting one pole of said battery when said battery is in place within said holder;
   (c) another electrically conductive terminal with one leg located in another recess in said peripheral barrier and another leg being resilient and contacting the other pole of said battery when said battery is in place within said holder;
   (d) said electrically conductive terminals each having a portion projecting from the top of said recess in said peripheral barrier and having one or more apertures to facilitate hard wire soldering, and
   (e) one or more positive locating nubs projecting from the bottom of said casing whereby the holder can be mounted on a printed circuit board in only one positive direction.

4. A battery holder according to claim 3, further comprising a snap-on cover which fits into one or more notches in said peripheral barrier.

5. A battery holder comprising:
   (a) a casing having a bottom end and a peripheral barrier means, the casing being disposed to receive a battery cell abutting the bottom and the peripheral barrier means, the casing being shaped such that is inner surface matches the contour of said cell;
   (b) an electrically conductive terminal having one leg located in a recess in said peripheral barrier and another leg being resilient and contacting one pole of said battery when said battery is in place within said holder;
   (c) another electrically conductive terminal with one leg located in another recess in said peripheral barrier and another leg being resilient and contacting the other pole of said battery when said battery is in place within said holder;
   (d) said electrically conductive terminals each having a portion projecting from the top of said recess in said peripheral barrier and having one or more apertures to facilitate hard wire soldering, and
   (e) a separate, non-integral, non-latching snap-on cover which fits into one or more notches in said peripheral barrier.

* * * * *